(12) United States Patent
Van Der Post

(10) Patent No.: US 10,613,448 B2
(45) Date of Patent: Apr. 7, 2020

(54) METHOD AND APPARATUS FOR DETERMINING ALIGNMENT PROPERTIES OF A BEAM OF RADIATION

(71) Applicant: ASML Netherlands B.V., Veldhoven (NL)

(72) Inventor: Sietse Thijmen Van Der Post, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/131,450

(22) Filed: Sep. 14, 2018

(65) Prior Publication Data
US 2019/0101840 A1 Apr. 4, 2019

(30) Foreign Application Priority Data

Oct. 3, 2017 (EP) .................... 17194483

(51) Int. Cl.
*G03B 27/54* (2006.01)
*G03F 9/00* (2006.01)
(Continued)

(52) U.S. Cl.
CPC .......... *G03F 9/7065* (2013.01); *G01B 11/272* (2013.01); *G01J 1/4257* (2013.01);
(Continued)

(58) Field of Classification Search
CPC .... G01N 21/47; G01N 21/4788; G01N 21/55; G01N 21/558; G01N 21/9501;
(Continued)

(56) References Cited

U.S. PATENT DOCUMENTS

| 5,229,872 A | 7/1993 | Mumola |
| 5,296,891 A | 3/1994 | Vogt et al. |

(Continued)

FOREIGN PATENT DOCUMENTS

| CN | 102 566 318 B | 5/2014 |
| EP | 3 321 739 A1 | 5/2018 |

(Continued)

OTHER PUBLICATIONS

English translation of JP2004-101438, published Apr. 2, 2004. (Year: 2004).*

*Primary Examiner* — Christina A Riddle
(74) *Attorney, Agent, or Firm* — Sterne, Kessler, Goldstein & Fox P.L.L.C.

(57) ABSTRACT

A method of and an apparatus for use in determining one or more alignment properties of an illumination beam of radiation emitted by a radiation source are provided. The illumination beam is for irradiating a target area on a substrate in a metrology apparatus. The method comprises: (a) obtaining a first set of intensity data; (b) obtaining a second set of intensity data; (c) processing said first and second sets of intensity data to determine said one or more alignment properties of said illumination beam of radiation; wherein said processing involves comparing said first and second sets of intensity data to calculate a value which is indicative of a translation of said illumination beam of radiation.

16 Claims, 9 Drawing Sheets

(51) Int. Cl.
*G03F 7/20* (2006.01)
*G01N 21/93* (2006.01)
*G01J 1/42* (2006.01)
*G01B 11/27* (2006.01)
*G01N 21/956* (2006.01)

(52) U.S. Cl.
CPC .......... *G01N 21/93* (2013.01); *G01N 21/956* (2013.01); *G03F 7/70141* (2013.01); *G03F 7/70516* (2013.01); *G03F 7/70616* (2013.01); *G03F 9/7092* (2013.01)

(58) Field of Classification Search
CPC .......... G01N 23/20008; G01N 23/205; G01N 2223/056; G01N 2223/0561; G01N 2223/0563; G01N 2223/0568; G01N 2223/1003; G01N 2223/1006; G01N 2223/1016; G01N 21/956; G01N 21/93; G01B 2210/56; G01B 11/272; G03F 9/7003; G03F 9/7007; G03F 9/7046; G03F 9/7049; G03F 9/7053; G03F 9/7065; G03F 9/7092; G03F 7/70141; G03F 7/70491; G03F 7/705; G03F 7/70508; G03F 7/70516; G03F 7/70525; G03F 7/70533; G03F 7/7055; G03F 7/70591; G03F 7/70625; G03F 7/70633; G03F 7/70666–70675; G03F 7/7085; G03F 7/70991; G03F 7/70033; G03F 7/70616; G01J 1/4257
USPC .............. 355/52, 53, 55, 67–71, 72–74, 77; 356/399–401, 450, 496, 499, 508–509, 356/521, 614–616, 388, 390, 395, 446, 356/51, 319, 324; 250/492.1, 492.2, 250/492.22, 492.23, 493.1, 503.1, 504 R, 250/505.1; 700/56–62; 702/94, 95, 150
See application file for complete search history.

(56) References Cited

U.S. PATENT DOCUMENTS

| 5,523,193 | A | 6/1996 | Nelson |
| 6,952,253 | B2 | 10/2005 | Lof et al. |
| 9,404,872 | B1* | 8/2016 | Wang .................... G01N 21/211 |
| 10,191,391 | B2 | 1/2019 | Pandey et al. |
| 2004/0129900 | A1* | 7/2004 | Den Boef ............. G03F 9/7046 250/559.3 |
| 2010/0140512 | A1 | 6/2010 | Suganuma et al. |
| 2011/0292365 | A1* | 12/2011 | Cramer .............. G01N 21/4785 355/67 |
| 2012/0123581 | A1 | 5/2012 | Smilde et al. |
| 2013/0100427 | A1* | 4/2013 | Koolen ..................... G03F 1/42 355/67 |

FOREIGN PATENT DOCUMENTS

| JP | 2004-101438 A | 4/2004 |
| JP | 2011-059335 A | 3/2011 |
| TW | 201721093 A | 6/2017 |
| WO | WO 99-49504 A1 | 9/1999 |
| WO | WO 2017/186491 A1 | 11/2017 |
| WO | WO 2018/050350 A1 | 3/2018 |

* cited by examiner

METHOD AND APPARATUS FOR DETERMINING ALIGNMENT PROPERTIES OF A BEAM OF RADIATION

FIELD

The invention relates to a radiation beam diagnostics tool and method, which may be incorporated in lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as CD=$k_1$×λ/NA, where λ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequent measurements of the structures created, e.g., for process control and verification. Tools to make such measurement are typically called metrology apparatus MT. Different types of metrology apparatus MT for making such measurements are known, including scanning electron microscopes or various forms of scatterometer metrology apparatus MT.

Recently, various forms of optical tools or scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a measurement signal from which a property of interest of the target can be determined.

Known inspection techniques employ radiation in the visible or ultraviolet waveband (e.g. greater than 200 nm). This limits the smallest features that can be measured, so that the technique can no longer measure the smallest features made in modern lithographic processes. To allow measurement of smaller structures, it has been proposed to use radiation of shorter wavelengths similar, for example, to the extreme ultraviolet (EUV) wavelengths used in EUV lithography. Such wavelengths may be in the range 1 to 100 nm, for example, or 1 to 125 nm. Part or all of this wavelength range may also be referred to as soft x-ray (SXR) wavelengths. Some authors may use SXR to refer to a narrower range of wavelengths, for example in the range 1-10 nm or 10-20 nm. For the purposes of the methods and apparatus disclosed herein, these terms SXR and EUV will be used without implying any hard distinction. Metrology using harder x-rays, for example in the range 0.1-1 nm may also be used.

For SXR metrology a source may be used that works on the principle of higher harmonic generation (HHG). A high power pulsed IR drive laser is focused in a gas-jet, in which a small fraction of the power is converted to shorter wavelengths. The generated wavelengths follow the odd harmonic orders: λ_generated=λ_drive/n where n is odd.

The source is subsequently demagnified in an optical illumination system and focused on a target on the wafer. The focus may underfill the target. Since the target is very small this is challenging both from a static point of view (spot needs to be small) and a dynamic point of view (spot needs to stand still). Small source positioning errors will lead to spot to target displacements and result in erroneous measurement results.

The size of SXR spots incident on detectors of a metrology apparatus is small, typically on the order of a number of detector pixels. This leads to tight requirements on the angular stability of the source: small beam pointing errors of the source result in changes in SXR spot positions on far field detectors. It may be desirable to have an angular stability as small as several μrad (micro-radians) at the source position.

Previous methods for stabilizing source positioning involved metrology on the IR drive laser. However, this is an indirect measurement and the source positioning and beam pointing of the SXR may well be subject to instabilities in the gas-jet (density variations, turbulence, plasma), resulting in fluctuations not captured by diagnostics on the IR.

SUMMARY

It is an object of the present invention to eliminate or mitigate position fluctuations of the spot relative to the target due to source position fluctuations and/or position fluctuations of the harmonic spots on far field detectors due to source beam pointing fluctuations.

The invention may provide a method of determining one or more alignment properties of an illumination beam of radiation emitted by a radiation source, wherein said illumination beam is for irradiating a target area on a substrate in a metrology apparatus, said method comprising:

(a) obtaining a first set of intensity data representing a reference measurement, said first set of intensity data representing a projection of a first beam of radiation originating from said illumination beam of radiation onto a first pixelated sensor;

(b) obtaining a second set of intensity data representing a projection of a second beam of radiation originating from said illumination beam of radiation onto the first pixelated sensor or a second pixelated sensor; and (c) processing said first and second sets of intensity data to determine said one or more alignment properties of said illumination beam of radiation;

wherein said processing involves comparing said first and second sets of intensity data to calculate a signal value which is indicative of a change in an alignment property of said illumination beam of radiation.

In one embodiment said second set of intensity data represents said projection of said second beam of radiation onto said second pixelated sensor and steps (a) and (b) are performed simultaneously.

In one embodiment said second set of intensity data represents said projection of said second beam of radiation onto said first pixelated sensor, and steps (a) and (b) are performed sequentially in time.

In one embodiment said projection of said second beam differs in position relative to said projection of said first beam by a distance; and said processing involves comparing said first and second sets of intensity data to calculate a value which is indicative of said distance.

In one embodiment said distance is less than the size of a pixel of said first or second pixelated sensor.

In one embodiment said step of processing comprises:

subtracting the second set of intensity data from the first set of intensity data to obtain a difference matrix;

calculating a gradient of intensity of the first set of intensity data to obtain a first gradient matrix;

performing elementwise multiplication of said difference matrix and said first gradient matrix to obtain a first signal matrix; and summing elements of said first signal matrix to obtain a first signal value indicative of a translation of said projection of said second beam along a first axis to a first coordinate in a plane of said first or second pixelated sensor.

The method may further comprise performing a coordinate transformation on said first coordinate according to a tool configuration to obtain a first source coordinate, wherein said first source coordinate defines a position of said radiation source.

The method may further comprise calculating a second gradient of intensity of the first set of intensity data to obtain a second gradient matrix;

performing elementwise multiplication of said difference matrix and said second gradient matrix to obtain a second signal matrix; and summing elements of said second signal matrix to obtain a second signal value indicative of a translation of said projection of said second beam along a second axis to a second coordinate in a plane of said first or second pixelated sensor.

In one embodiment said first axis is substantially perpendicular to said second axis.

The method may further comprise performing a coordinate transformation on said second coordinate according to a tool configuration to obtain a second source coordinate, wherein said second source coordinate defines a position of said radiation source.

In one embodiment said steps of obtaining intensity data comprise detecting beams of radiation diffracted by a first periodic structure.

In one embodiment said first periodic structure is arranged to diffract radiation into at least a first positive diffraction order and a first negative diffraction order, and said first beam of radiation comprises said radiation diffracted into said first positive diffraction order and said second beam of radiation comprises said radiation diffracted into said first negative diffraction order.

In one embodiment said first periodic structure is arranged to diffract radiation into a second diffraction order, and said first and second sets of intensity data are obtained by detecting radiation diffracted into said second diffraction order.

In one embodiment said first pixelated sensor is in the far-field of said first periodic structure.

In one embodiment said second pixelated sensor is in the far-field of said first periodic structure.

In one embodiment said radiation source is a higher harmonic generation (HHG) source, and said illumination beam of radiation comprises a plurality of harmonics of radiation.

In one embodiment said radiation source is a target area on a substrate, and radiation emitted by said radiation source is radiation reflected by said target area.

In one embodiment said target area comprises a substrate periodic structure formed on said substrate, and radiation emitted by said radiation source is radiation diffracted by said substrate periodic structure.

In one embodiment said illumination beam of radiation is a beam of radiation diffracted into a zeroth diffraction order by said substrate periodic structure.

In one embodiment said one or more alignment properties comprise a position of said illumination beam of radiation.

In one embodiment said one or more alignment properties comprise a propagation direction from the radiation source of said illumination beam of radiation.

In one embodiment said first and second beams of radiation comprise wavelengths forming a part but not the whole of a radiation source emission spectrum.

In one embodiment:

step (a) further comprises obtaining one or more further first sets of intensity data, wherein each of said further first sets represents a beam of radiation consisting of other wavelengths forming a part but not the whole of the radiation source emission spectrum;

step (b) further comprises obtaining one or more respective further second sets of intensity data, wherein said respective further second sets represent said other wavelengths; and step (c) further comprises processing said further first sets of intensity data and said respective further second sets of intensity data, by comparing the first sets with respective second sets of intensity data, to determine one or more further alignment properties related to said other wavelengths.

In one embodiment said wavelengths and said other wavelengths comprise different harmonics of radiation in the radiation source emission spectrum.

The method may comprise combining said one or more further alignment properties to obtain one or more combined alignment properties.

The invention also provides a method of stabilizing an illumination beam of radiation, said method comprising:

determining one or more alignment properties of said illumination beam of radiation according to a method of any preceding claim; and using said one or more alignment properties to control the radiation source in order to adjust a value of at least one of said alignment properties to a target value of said at least one alignment properties.

The method of stabilizing an illumination beam of radiation may comprise:

determining one or more alignment properties of said illumination beam of radiation according to a method of any preceding claim, wherein said one or more alignment properties comprise a position of the illumination beam of radiation; and using the determined position to control the radiation source in order to adjust the position of said illumination beam of radiation to a target position.

The method of stabilizing an illumination beam of radiation may comprise:

determining one or more alignment properties of said illumination beam of radiation according to any preceding claim, wherein said one or more alignment properties comprise a propagation direction from the radiation source of the illumination beam of radiation; and using the determined propagation direction to control the radiation source in order to adjust the propagation direction of the illumination beam of radiation to a target propagation direction.

Said step of using may comprise providing closed loop feedback to a control system.

The invention also provides a metrology apparatus for use in determining a property of a structure on a substrate and to determine one or more alignment properties of an illumination beam of radiation emitted by a radiation source, said apparatus comprising:

an irradiation system for generating said illumination beam of radiation;

a substrate support operable with the irradiation system for irradiating a periodic structure formed on a target area of the substrate held by said substrate support;

a specular detection branch detector for detecting a spectrum of radiation diffracted by the periodic structure; and one or more processors configured to:

obtain a first set of intensity data representing a reference measurement, said first set of intensity data representing a projection of a first beam of radiation originating from said illumination beam of radiation onto a first pixelated sensor;

obtain a second set of intensity data, said second set of intensity data representing a projection of a second beam of radiation originating from said illumination beam of radiation onto said first pixelated sensor, or a second pixelated sensor; and process said first and second sets of intensity data to determine said one or more alignment properties of said illumination beam of radiation;

wherein said processing involves comparing said first and second sets of intensity data to calculate a value which is indicative of a change in an alignment property of said illumination beam of radiation.

The apparatus may further comprise a reference detector for detecting a reference spectrum of radiation of said illumination beam of radiation upstream of said periodic structure.

In one embodiment said property of the structure is determined from said spectrum of radiation and said reference spectrum of radiation.

In one embodiment said specular detection branch detector comprises said first pixelated sensor.

In one embodiment said reference detector comprises said first pixelated sensor.

The apparatus may further comprise a control system configured to control at least one of said irradiation system and said substrate support, in order to adjust a value of at least one of said alignment properties to a target value of said at least one alignment properties.

In one embodiment said one or more processors are configured to perform any of the methods described above.

The invention also provides a lithographic cell comprising a metrology apparatus as described above.

The invention also provides a computer program product comprising a non-transitory computer readable medium having instructions recorded thereon, the instructions when executed by a computer implementing any of the methods described above.

Preferred embodiments of the invention will now be described, by way of example only, with reference to the accompanying drawings.

BRIEF DESCRIPTION OF THE DRAWINGS

Embodiments of the invention will now be described, by way of example only, with reference to the accompanying schematic drawings, in which.

DETAILED DESCRIPTION

Figure 1:
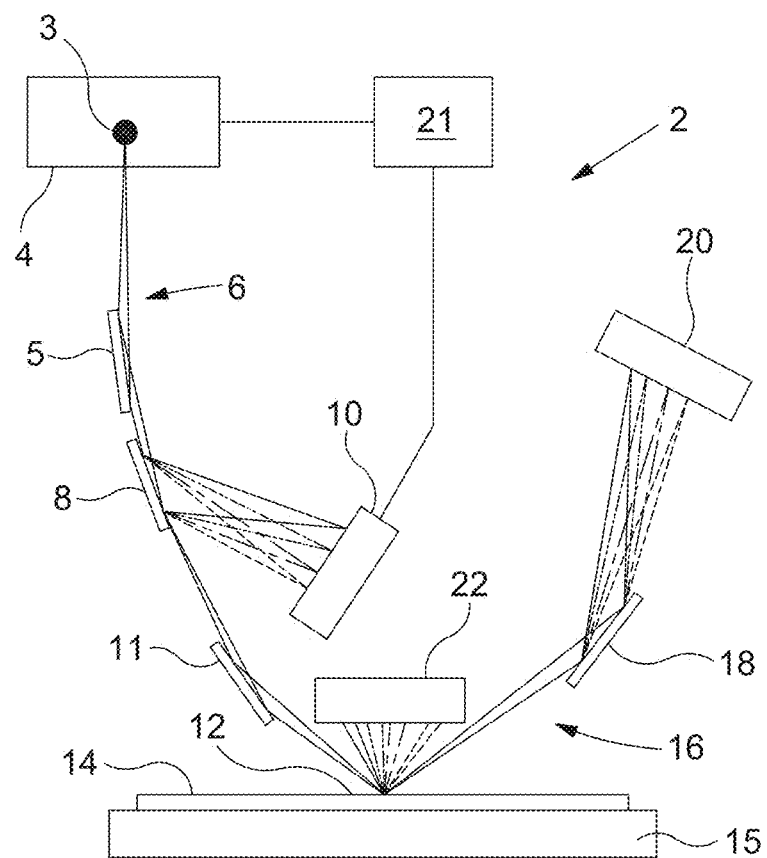
FIG. 1 depicts a schematic overview of a part of a metrology apparatus.

FIG. 1 shows part of a metrology apparatus 2 (or inspection apparatus 2) which may be used in an embodiment. An irradiation system 4 (e.g. a HHG source) provides a source 3 which provides an illumination beam of radiation 6 containing radiation with a spectrum of frequencies. HHG sources which may be used in the metrology system 2 are described in EP16198346.5, filed Nov. 11, 2016, and PCT/EP2017/058771 with priority date Apr. 28, 2016, and the contents of these applications are incorporated herein by reference. In the case where the irradiation system 4 is a HHG source, the emission spectrum comprises odd harmonics of the frequency of an IR drive laser generated in a gas-jet. The odd harmonics may be soft X-rays (SXR) and/or Extreme Ultraviolet (EUV) radiation. If the term soft X-ray (SXR) is used in this document, one may also read Extreme Ultraviolet (EUV) radiation or one may read the combination of soft X-ray (SXR) and Extreme Ultraviolet (EUV). The IR drive frequency may be filtered using a filter (not depicted), so that the illumination beam of radiation 6 only consists of the odd harmonics 6. A mirror 5 reflects the illumination radiation beam 6 towards a diffraction grating 8 which is referred to herein as a reference grating. The reference grating 8 (which may be considered as a first periodic structure) diffracts the incident beam of radiation 6. The beam is diffracted into multiple diffraction orders at different diffraction angles. Beams of radiation diffracted into higher (>0) diffraction orders are captured by a reference detector 10, which comprises a pixelated sensor. The reference grating 8 and reference detector 10 may be referred to as being in a reference detection branch. Radiation diffracted into the zeroth diffraction order is demagnified and focused by a mirror 11 onto a target area 12 of a substrate 14 held on a substrate support 15. The radiation is diffracted from the target area 12. The target area 12 may comprise a substrate periodic structure formed thereon. Zeroth order 16 diffracted radiation (which may be referred to as specular reflected radiation) is incident upon another grating 18 (which may also be referred to more generally as a type of periodic structure). This grating 18 may be referred to as being in a specular detection branch of the metrology apparatus 2. The specular detection branch is downstream (after) the substrate 14 in the beam path, whereas the reference detection branch is upstream (before) the substrate 14 in the beam path. Radiation diffracted by grating 18 is captured by another detector 20, comprising a pixelated sensor, for further signal processing. The higher orders of radiation diffracted from the target area 12 are also captured by a detector 22, comprising a pixelated sensor, for further signal processing. The detector 22 which detects the higher orders of radiation diffracted from the target area 12 is in the far field with respect to the focused spot of SXR radiation on the target area 12. The detector 22 may be referred to as the higher order detector 22. More than one higher order detector 22 may be provided.

In operation, the reference detector 10 may obtain a first set of intensity data representing a reference measurement. The first set of intensity data represents a projection of a first beam of radiation onto the pixelated sensor of the reference detector 10. The first beam of radiation is one of the beams diffracted by the reference grating 8. The first beam of radiation comprises a part of the source emission spectrum, e.g. a single harmonic or a few harmonics of radiation or other wavelengths. A second set of intensity data is obtained subsequently from the reference detector 10. The second set of intensity data represents the projection of a second subsequent beam of radiation onto the pixelated sensor of reference detector 10. The second subsequent beam of radiation comprises the same part of the source emission spectrum of the illumination radiation beam 6 as the first beam of radiation, e.g. the same single harmonic of radiation or other wavelengths. Beams of radiation with different frequencies have different diffraction angles (for higher order diffraction). In order to compare a spot position on the pixelated sensor of the reference detector 10, the first set of intensity data and the second set of intensity data should represent projections of respective beams of radiation having the same frequencies, i.e. the same part of the source emission spectrum.

The first and second sets of intensity data may be processed in order to determine a difference in position on the pixelated sensor of the reference detector 10 of the projected first and second beams of radiation. The first and second sets of intensity data can be compared in order to determine a first and a second coordinate (x and y) on the pixelated sensor of the reference detector 10, representing the difference in position of the first and second beams, i.e. the translation of the projection of the second beam relative to the first beam. Such a difference may indicate a change in an alignment property, for example a translation, of the illumination beam of radiation 6 (e.g. a movement of the position at which the illumination beam of radiation is incident on the reference grating 8). This could be due to, for example, movement of the source 3 of the irradiation system 4. Movement of the source 3 may be due to instabilities in the gas-jet (density variations, turbulence, plasma) of the irradiation system 4. By processing the first and second sets of intensity data one or more alignment properties of the illumination beam of radiation 6 can be determined. The determined alignment properties may be used to control the irradiation system 4 in order to adjust a value of at least one of the alignment properties to a target value. The target value may represent a target position of the illumination beam of radiation 6.

A coordinate transformation can be performed on the first and second coordinates to obtain first and second source coordinates, which in this embodiment relate to a change in position of the source 3. Such a coordinate transformation may be performed according to a tool configuration, i.e. it may depend on the specific geometry of the metrology apparatus 2.

Alternatively or additionally, if the first and second sets of intensity data were obtained by detecting the first and second beams of radiation in the far field from the reference grating 8, the change in position may be indicative of a change in the direction of propagation of the illumination beam of radiation 6 (i.e. a change in beam pointing). The direction of propagation of the illumination beam of radiation is another alignment property of the illumination beam of radiation 6. As explained further below, determined alignment properties may be used in a feedback loop to control the irradiation system 4 and/or other components, such as the position of the tilt of the mirrors 5 and 11, of the metrology apparatus 2. This may reduce movement of the illumination beam of radiation 6 relative to the substrate 14. In one example, determined beam pointing may be used to control an angle of the illumination beam of radiation emitted by the source 3 of the irradiation system 4. That is, the determined propagation direction may be used to control the irradiation system 4, in order to adjust the propagation direction of the illumination beam of radiation 6 to a target propagation direction.

Embodiments of the invention may use the light dispersed by the reference grating 8 (as well as the grating 18 in the specular detection branch) to obtain a signal that can be used in closed loop control of the source position and beam pointing. Examples of suitable closed loop control methods are described in PCT/EP2017/069506 with priority date Sep. 14, 2016, and the contents of that application are incorporated herein by reference. There are a number of implementations as well as a number of ways the signals can be used. Beam pointing refers to the propagation direction of a beam of radiation.

The processing may comprise subtracting the second set of intensity data from the first set of intensity data to obtain a difference matrix. Each element of the difference matrix represents a pixel of the pixelated sensor of the reference detector 10, and the value of an element represents the difference in intensity of the incident first and second beams of radiation on that pixel. A (spatial) gradient of intensity of the first set of intensity data is calculated to obtain a first gradient matrix. The first gradient matrix represents the spatial gradient of intensity along x or y (or some arbitrarily defined coordinate axis in the sensor plane) of the projection of the first beam of radiation. The difference matrix and the gradient matrix are multiplied (by elementwise multiplication) to obtain a first signal matrix. Each element of the signal matrix is summed to obtain a first signal value. The first signal value is a scalar number indicative of a translation of the second beam of radiation along an axis (depending on the direction of the spatial gradient) to a first coordinate. The coordinate is in the plane of the pixelated sensor of the reference detector 10 and represents the translation of the second beam relative to the first beam along an axis (e.g. x or y). The axis is the same axis as along which the spatial gradient of the first set of intensity data is taken to obtain the first gradient matrix. For example, if the gradient of the first set of intensity data is taken along x, then the first signal value will be indicative of a translation to a coordinate along the x axis. A second signal value may then be obtained from the same first set and the same second set of intensity data by repeating the steps but taking a different spatial gradient (e.g. along y), to obtain a second gradient matrix. The second gradient matrix is also multiplied with the (same) difference matrix, to obtain a second signal matrix. Each element of the second signal matrix is summed to obtain the second signal value. The second signal value is a scalar number indicative of a translation of the second beam of radiation along an axis to a second coordinate. The second coordinate is also in the plane of the pixelated sensor of the reference detector 10. Preferably the second signal value relates to a translation along an axis which is perpendicular or substantially perpendicular to the axis along which the first signal value indicates a translation. The signal values are directly related to the positions of the first and second beams of radiation, but are also indicative of a change in an alignment property of the illumination beam of radiation 6 from which the first and second beams originated. For example, a translation or change of propagation direction of the illumination beam of radiation 6 causes a translation of the second beam of radiation on the pixelated sensor of the reference detector 10, which is indicated by the signal values.

The first and second signal values may be used, for example, in closed loop feedback to a control system 21. The control system 21 may control one or more components of the metrology apparatus 2 (e.g. the irradiation system 4) in order to achieve desired alignment properties of the illumination beam of radiation 6 with respect to the target area 12 irradiated by the illumination beam. That is, the control system may be configured to control the one or more components of the metrology apparatus in order to adjust a value of at least one of the alignment properties of the illumination beam of radiation 6 to a target value. For example, the control system may be configured to minimize the difference in position of the projections of the first and second beams of radiation on the pixelated sensor of the reference detector 10. This can be accomplished by controlling the irradiation system 4 in order to adjust the position of the illumination beam of radiation 6 to a target position. The target position may be defined on the target area 12 of the substrate 14, or on the reference grating 8.

In an embodiment, a plurality of further first sets of intensity data are obtained, each representing a projection of a beam of radiation comprising a different part of the source emission spectrum (i.e. other wavelengths of the illumination beam of radiation 6). For example, each beam of radiation may consist of a different harmonic of radiation in the emission spectrum of the radiation source. Respective further second sets of intensity data are also obtained. The further second sets of intensity data represent projections of corresponding beams of radiation, i.e. beams of radiation consisting of the same part of the source emission spectrum (i.e. the other wavelengths). For example, if one of the further first sets of intensity data represents a projection of a beam of radiation consisting of the third harmonic of radiation, then a respective further second set of intensity data obtained, represents the third harmonic detected subsequently. Each first set and corresponding second set of intensity data may be processed separately (from any other first and second set of intensity data), in order to determine wavelength dependent alignment properties of the illumination beam of radiation 6. Alternatively, an alignment property determined by processing one first set and the corresponding second set of intensity data, may be combined (e.g. averaged) with one or more further alignment properties determined by processing one or more other first sets and corresponding second sets of intensity data, in order to obtain one or more combined alignment properties. For example, the translation associated with each projected second beam on the pixelated sensor may be averaged to obtain an average translation of the illumination beam of radiation. In addition to the use of different harmonics it is also possible to use a source, for example a DPP source, in which different plasma emission peaks are distinguished from each other in a similar fashion to the harmonics described above, or any other type of source which achieves the same effect.

In an embodiment, the first set of intensity data, representing a reference measurement, may be obtained from calibration measurements, which have been carried out at a previous time and then stored. That is, while the second set of intensity data (and the respective further second sets of intensity data) are obtained in situ (during normal operation of the metrology apparatus), the first set of intensity data (and the further first sets of intensity data) may be obtained from a stored location (e.g. a computer memory).

With reference to FIG. 1, the first set of intensity data and the second set of intensity data may also be obtained from the higher order detector 22, which comprises a pixelated sensor. Although only one higher order detector 22 is referred to in the description below, more than one higher order detector may be provided. In the depicted embodiment, the illumination beam of radiation 6 incident upon the target area 12 of the substrate 14 is the zeroth diffraction order of the reference grating 8. The reference grating 8 may be referred to more generally as a first periodic structure. The target area 12 may comprise a periodic structure, which may be considered as a substrate periodic structure, which diffracts the incident beam of radiation 6. The beam of radiation is diffracted into higher orders (>0) which are detected by the higher order detector 22. In an embodiment, a first set of intensity data represents a projection of a first beam of radiation onto the pixelated sensor of the higher order detector 22, and a second set of intensity data represents a projection of a second subsequent beam of radiation onto the pixelated sensor of the higher order detector 22, obtained sequentially in time. The first and second sets of intensity data may be processed to determine one or more alignment properties of the illumination beam of radiation 6. Because the illumination beam of radiation was scattered by the substrate 14, the alignment properties also relate to substrate 14. For example, a rotational movement or instability in the substrate support 15 may cause a change in the angle of incidence of the illumination beam of radiation upon the substrate 14, which may in turn cause a translation of the position/coordinates of the projection of the second beam relative to the projection of the first beam on the pixelated sensor of the higher order detector 22. Hence, the determined alignment properties may be used to control the substrate support 15 as well as the irradiation system 4. Again, the first and second source coordinates (the source being the target area 12 on the substrate 14 in this case) may be obtained by a coordinate transformation according to a tool configuration.

The control system 21 may distinguish between movement of the substrate support 15 and movement of the incident beam of radiation 6. Measurements obtained using the reference grating 10 are indicative only of movement of the incident beam of radiation 6, whereas measurements obtained using the higher order detector 22 are indicative both of movement of the incident beam of radiation 6 and movement of the substrate 14. Thus, the control system 21 may distinguish between movement of the incident beam of radiation 6 and movement of the substrate support 15 by comparing measurements obtained using the reference detector 10 and measurements obtained using the higher order detector 22.

In another embodiment, alternatively or additionally, the first and second sets of intensity data may be obtained from the detector 20 (comprising a pixelated sensor) of the specular detection branch (which comprises grating 18 and detector 20). This detector 20 may be referred to as the specular detection branch detector 20. In this embodiment, the illumination beam of radiation is the zeroth order diffraction of the substrate 14. That is, the illumination beam of radiation, which is incident upon the diffraction grating 18 (which may be considered as a first periodic structure), is reflected from the target area 12 of the substrate 14. The target area 12 may comprise a substrate periodic structure formed thereon. The illumination beam of radiation may be diffracted by the first periodic structure 18 (diffraction grating 18) into multiple diffraction orders with different diffraction angles. A first set of intensity data represents a projection of a first beam of radiation onto the pixelated sensor of the specular detection branch detector 20, and a second set of intensity data represents a projection of a second subsequent beam of radiation onto the pixelated sensor of the specular detection branch detector 20, obtained sequentially in time. The first and second sets of intensity data may be processed to determine one or more alignment properties of the illumination beam of radiation. As the illumination beam of radiation has interacted (scattered from) several different parts/components of the metrology apparatus 2 before being diffracted and captured by the specular detection branch detector 20, the determined alignment properties relate to the irradiation system 4, the substrate 14, and any other component in the beam path. This embodiment may be particularly useful for correcting misalignments of the substrate 14, by controlling the substrate support 15. The determined alignment properties of the illumination beam of radiation may be used to control the substrate support 15 in order to adjust the position and propagation direction of the illumination beam of radiation to a target position and a target propagation direction. Hence, the spot position and angle of incidence of the beam of radiation irradiating the target area 12 of the substrate 14 can be controlled.

For the purposes of this specification "radiation source" may refer to any radiation emitter, and is not constrained to the irradiation system that generates the radiation (e.g. the HHG source). Hence, "radiation source" may also refer to the substrate 14 which reflects the beam of radiation, and the "emitted beam of radiation" in this context is the beam of radiation reflected by the substrate 14.

The working principle is utilizing the fact that the HHG harmonic peaks are 1) spectrally narrow and 2) can be focused to spots that are of the same size scale as the pixels of the detectors that are used to capture the light.

Although the embodiments described herein refer to a metrology apparatus (or metrology tool) and more specifically to a metrology apparatus for use in determining performance parameters of a lithographic process, the method is more widely applicable to other types of inspection apparatuses and for determining other properties and parameters. Similarly, although the use of a HHG source provides certain advantages, the invention is not limited to the use of HHG, but may be applied to a system with an alternative irradiation system (e.g. Laser-Produced Plasma, LPP, source, a Discharge Produced Plasma, DPP, source, or a synchrotron).

Figure 2:
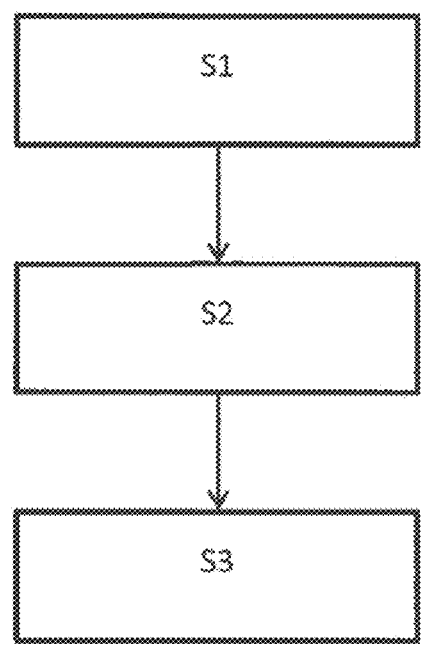
FIG. 2 depicts a flow chart of the steps of an embodiment of a method for determining one or more alignment properties.

FIG. 2 shows the steps of a method according to an embodiment. The method comprises: 1) obtaining a first set of intensity data representing a reference measurement, said first set of intensity data representing a projection of a first beam of radiation originating from said illumination beam of radiation onto a pixelated sensor (of a detector), referred to as step S1 in FIG. 2; 2) obtaining a second set of intensity data, said second set of intensity data representing a projection of a second subsequent beam of radiation originating from said illumination beam of radiation onto said pixelated sensor, referred to as step S2 in FIG. 2; and 3) processing said first and second sets of intensity data to determine said one or more alignment properties of said illumination beam of radiation, wherein said processing involves comparing said first and second sets of intensity data to calculate a value which is indicative of a translation of said illumination beam of radiation, referred to as step S3 in FIG. 2. In a modified method (described further below), steps S1 and S2 may be performed simultaneously using different detectors.

Figure 3:
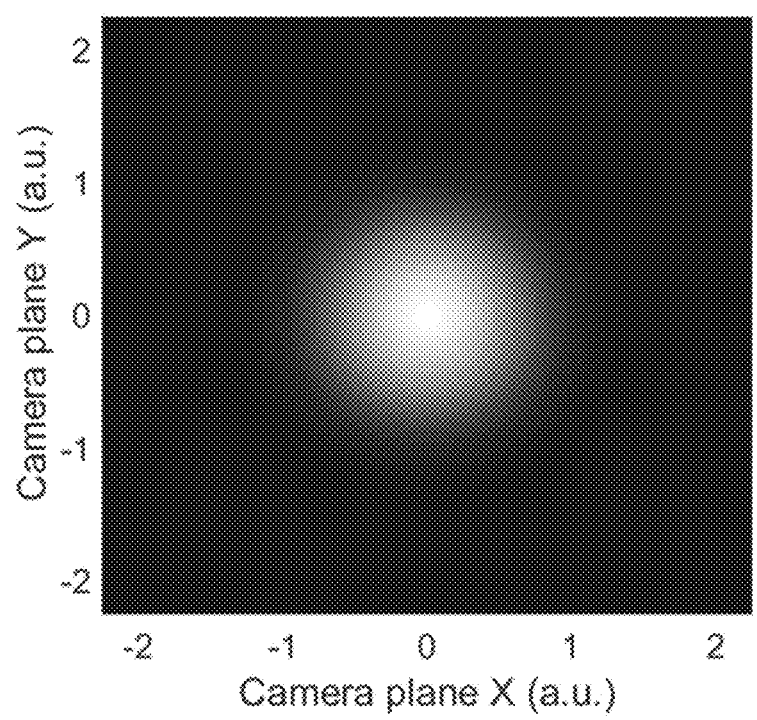
FIG. 3 depicts a projection of a beam of radiation onto a sensor.

FIG. 3 shows a realistic (but for this purpose simplified) example of how a single harmonic may look if focused on the reference detector 10. The image represents a beam of radiation, comprising a single harmonic, projected onto a pixelated sensor of a detector (e.g. the reference detector 10). In the rest of this example only one harmonic is considered, though the same principles apply to the whole spectrum. For example, the described method may be applied to each harmonic projected onto the detector.

Figure 4B:
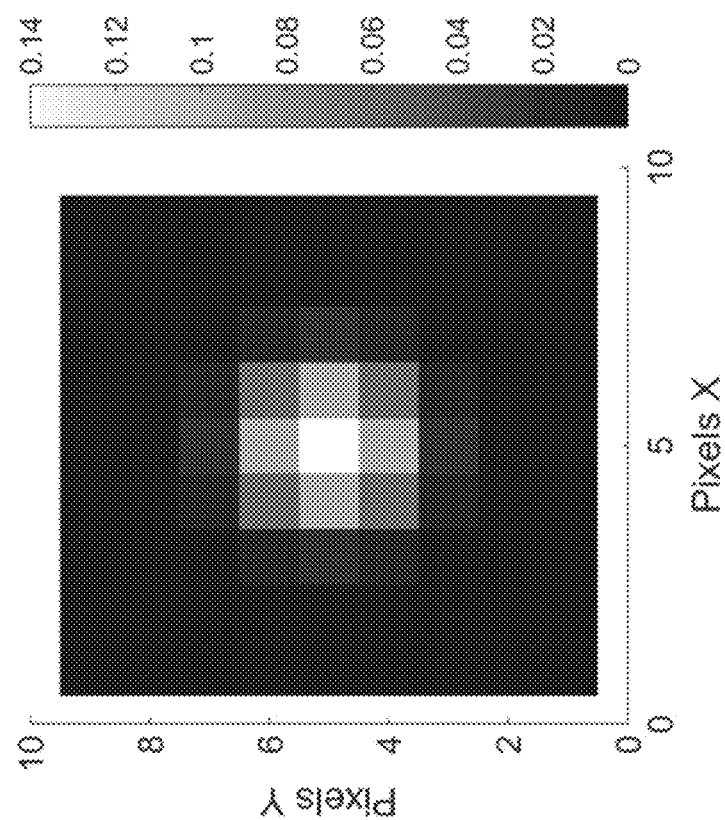
FIG. 4b depicts a projection of a shifted beam of radiation on a pixelated sensor.
Figure 4A:
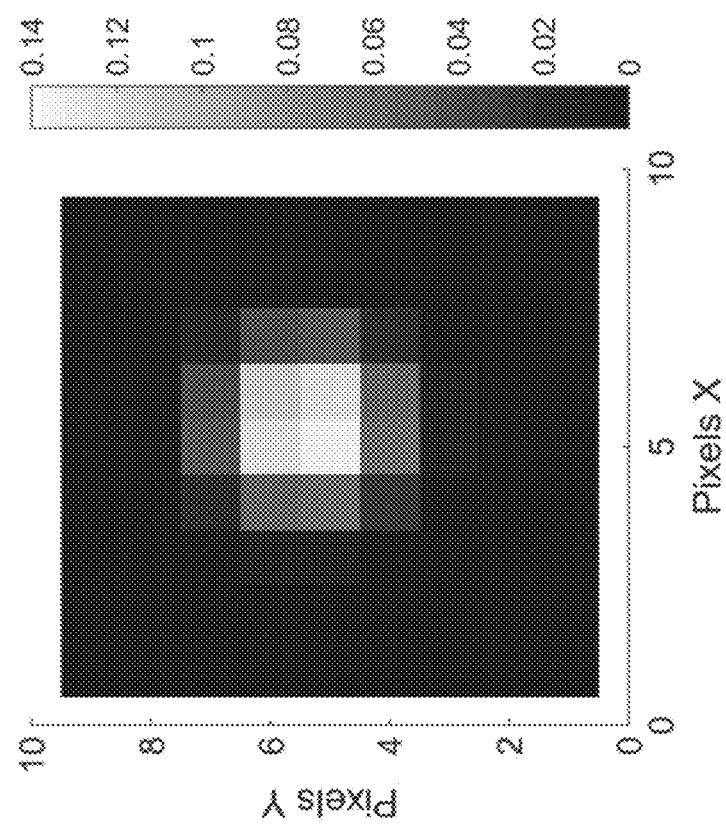
FIG. 4a depicts a projection of a beam of radiation on a pixelated sensor.

FIG. 4a shows how this image actually looks when taking the pixels of the pixelated sensor of the detector into account. The sensor measures the intensity of light incident on each pixel, and outputs a set of intensity data comprising a matrix. Each element of the matrix represents (corresponds to) one pixel of the pixelated sensor, and the value of that element represents the intensity of light incident on that pixel.

Figure 6:
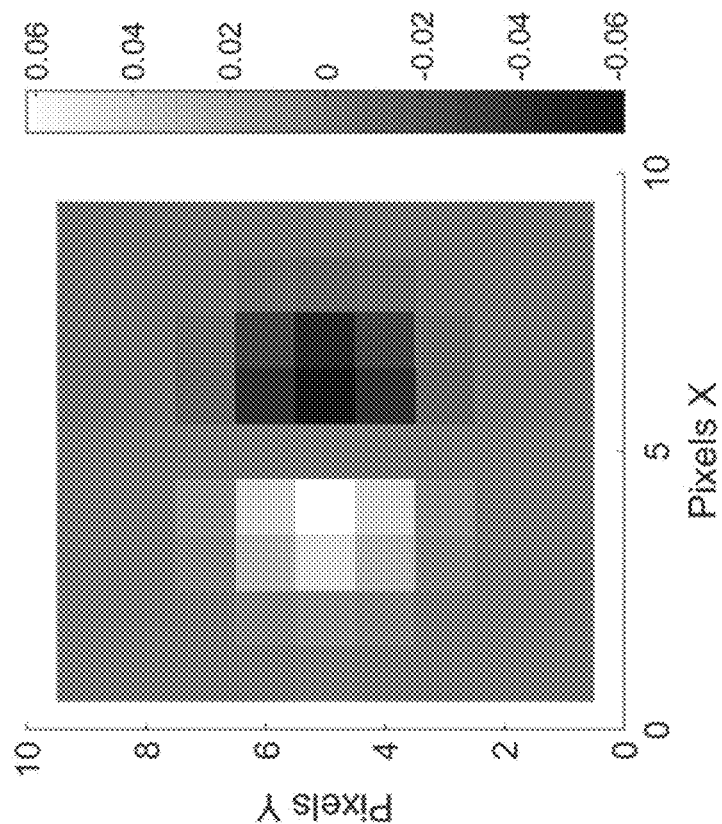
FIG. 6 depicts a gradient matrix.
Figure 5:
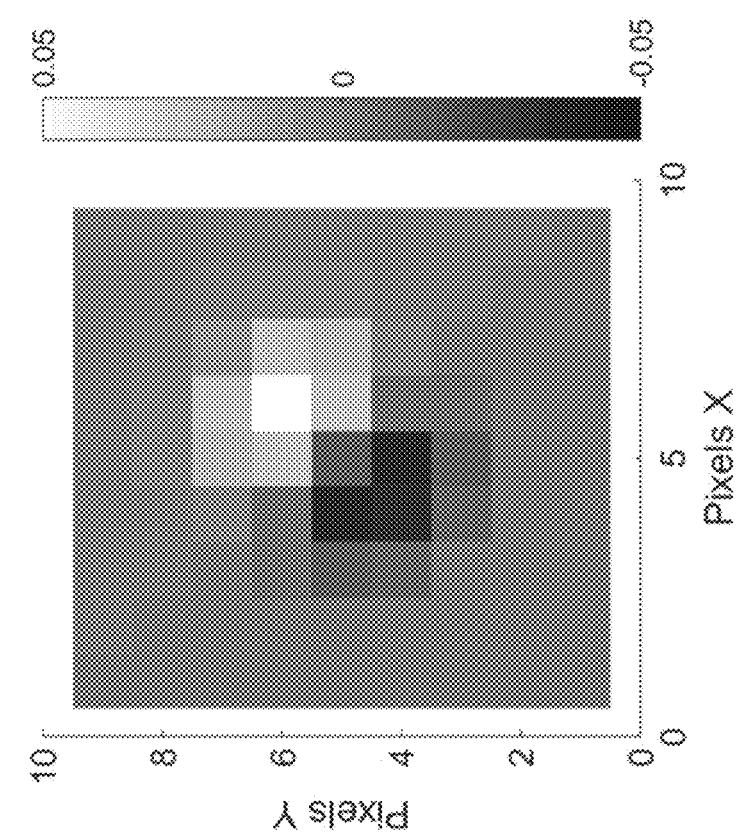
FIG. 5 depicts a difference matrix.
Figure 7:
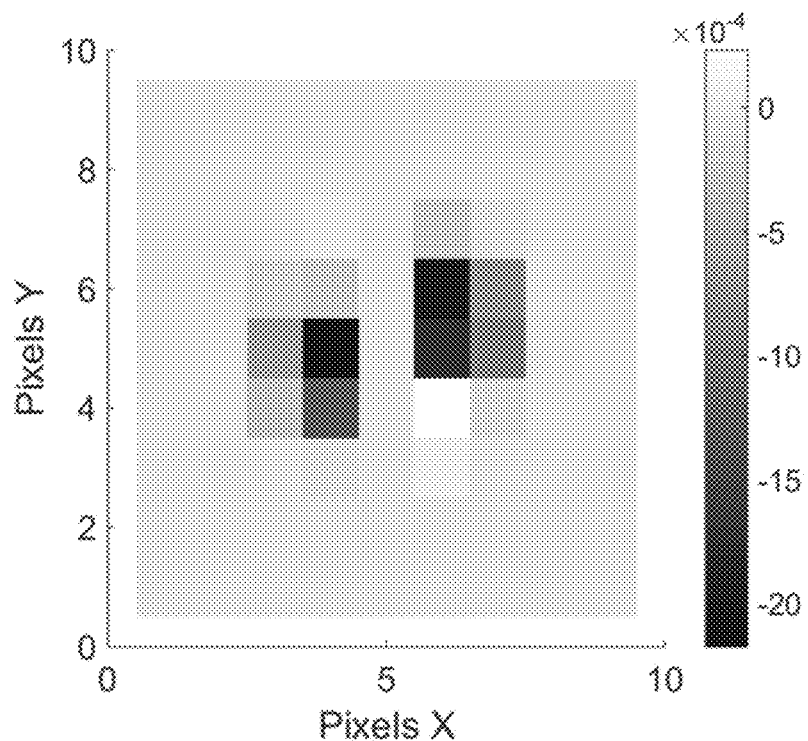
FIG. 7 depicts a signal matrix.

Since the pixelated sensor of the reference detector 10 is in a field plane, if the radiation source 3 is displaced (e.g. suffers from position fluctuations), the spot of the beam of radiation on the pixelated sensor of reference detector is displaced resulting in the image shown in FIG. 4b. Movement of the spot on the pixelated sensor of the reference detector 10 is smaller than movement of the spot on the substrate 14, by a factor equal to the demagnification of the metrology apparatus. The displacements that are required to be captured can be small: The demagnification between the reference detector 10 and the target area 12 is e.g. 4×, in which case measuring a position change of 50 nm at the target area requires a 200 nm resolution on the pixelated sensor of the reference detector. This is a fraction of a pixel, e.g. $1/50^{th}$ of a pixel width. In order to use this effect to create a signal to use in a control loop, an algorithm is proposed that can achieve the required sub-pixel resolution. The algorithm is described in relation to measurements obtained using the reference detector 10. However, the algorithm may be used for measurements obtained using other detectors, such as the other detectors 20, 22 described above or other detectors which are described further below.

a) A zeroth-image of the reference detector 10 is called $I_0$. This zeroth-image is a first set of intensity data. The zeroth-image may be newly obtained at the beginning of a target measurement (i.e. at the beginning of an acquisition period), or each time the algorithm is run. Alternatively, the zeroth-image may have been obtained previously, for example during a previous target measurement or during a calibration measurement, in which case the same zeroth-image may be used multiple times by the algorithm. The calibration measurement may be repeated periodically (e.g. each week or each month) to generate a new zeroth-image.

b) At time intervals within the target measurement, a frame is obtained from the reference detector 10, being image $I(t_k)$ for the k-th image. Each image $I(t_k)$ is a second set of intensity data. The first and second sets of intensity data are obtained sequentially in time in this example. The first and second sets of intensity data may alternatively be obtained simultaneously if more than one detector is used (e.g. as described further below).

c) First, a difference matrix $M(t_k)=I_0'-I'(t_k)$ is taken from the total-intensity normalized images $I_0'$ and $I'(t_k)$, such as represented in FIG. 5 for the data shown in FIGS. 4a and 4b. The image in FIG. 4a can be regarded as $I_0$ and the image in FIG. 4b can be regarded as $I(t_k)$. $M(t_k)$ is the difference matrix obtained by subtracting the first set of intensity data $I_0$ from the second set of intensity data $I(t_k)$.

d) Second, gradient matrices $G_x$ and $G_y$ in the X and Y directions are made from the zero-image $I_0$. $G_x$ is a first gradient matrix obtained by taking the spatial gradient of the first set of intensity data along x, and $G_y$ is a second gradient matrix obtained by taking the spatial gradient of the first set of intensity data along y. FIG. 6 shows the first gradient matrix $G_x$ for the current example (the second gradient matrix $G_y$ is not shown).

e) The signal value $S_x(t_k)$ is calculated by summing over all pixels (matrix elements) for the element-wise product of $G_x$ with $M(t_k)$:

$$S_x(t_k) = \text{SUM}\_ij(G_x\_ij * M\_ij(tk)),$$

where i and j are the pixel indices of the whole image. That is, i and j are the element indices of the matrices. FIG. 7 shows the product of the first gradient matrix $G_x$ and the difference matrix $M(t_k)$, referred to as a first signal matrix. In a corresponding fashion, signal $S_y(t_k)$ (not shown) can be constructed.

f) The first and second signal values, $S_x$ and $S_y$, correspond to the X and Y coordinates in the plane of the reference detector 10. A coordinate transformation according to the tool configuration leads to an interpretation of these signals in the X' and Y' coordinates of the source. When considering coordinate transformations relevant directions are those orthogonal to the propagation direction. At the point of SXR generation, these directions can be represented by orthogonal X and Y coordinates, for example the horizontal and vertical plane of the lab/fab. The pixel grid on the sensor/camera can be represented by X' and Y', for horizontal and vertical lines, respectively. At wafer level we may use coordinates X" and Y", which are for example in the meridional and sagittal plane, respectively. The three coordinate sets (i.e. X, Y and X', Y' and X", Y") can then be transformed to each other by a simple rotation matrix. Extra amplitudes A can be added to the matrix to account for the fact that a displacement of D in the (X,Y) coordinates leads to a displacement A*D in another coordinate system. 'A' can be made X/Y dependent.

The elementwise multiplication of a gradient matrix with the difference matrix (step e) above) gives a signal matrix (not shown). The signal value $S_x$ or $S_y$ is the sum of the value (intensity) of each element of the signal matrix. The signal value $S_x$ or $S_y$ is a single value indicative of an alignment property of the beam projected onto the pixelated sensor to form the $I(t_k)$ image (represented by the second set of intensity data). That is, $S_x$ is indicative of a translation along the x-axis of a second beam of radiation relative to a first beam of radiation, and $S_y$ is indicative of a translation along the y-axis of that second beam of radiation.

Figure 8:
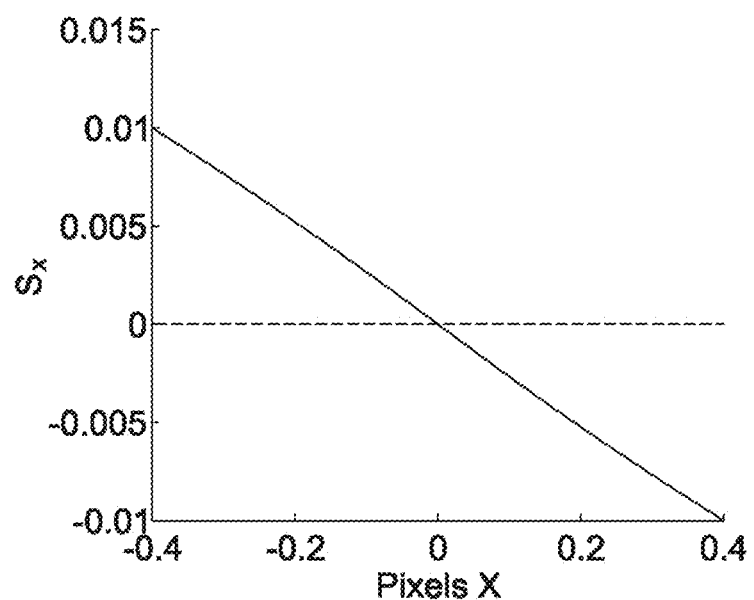
FIG. 8 depicts a graph with signal $S_x$ plotted against Pixels X.

To verify the robustness of the signals, $S_x$ was calculated in a simulation for varying displacement with the addition of photon shot noise per pixel for the expected number of photons for a measured harmonic and an uncorrelated constant background noise per pixel of 1% of the maximum pixel intensity. The result is shown in FIG. 8. FIG. 8 shows the first signal value $S_x$ plotted against distance x in units of number of pixels. The x-axis goes from −0.4 to 0.4 pixels, such that the entire axis covers 0.8 pixels, i.e. slightly less than the size/width of a whole pixel. Hence, it can be seen from the figure that even very small translations, representing small changes in alignment properties, can be determined. The relationship between $S_x$ and image displacement is linear and can readily be used in a control loop. Much higher levels of noise can be applied in the simulation (for example by increasing the sampling rate $1/t_k$), while still providing a sufficiently strong relationship to allow measurement accuracy down to 1/50th of a pixel. Since this analysis can be done per harmonic, the signal values which are used by embodiments of the invention can be made wavelength dependent. That is, where there are multiple harmonic spots on the pixelated sensor of a detector, each spot may represent a further first set or a further second set of intensity data. No additional hardware is needed for this basic implementation, making it a cost effective solution. That is, the reference detector 10, or the specular detection branch detector 20, which are already used in the metrology apparatus 2 for determining a property of a structure on the substrate 14, may be used to implement the above described embodiment.

The metrology apparatus 2 focuses an illumination beam of radiation 6 onto a target area 12 of a substrate 14. The target area 12 may be a grating or other periodic structure formed on the substrate 14 by a lithographic process. The beam 6 is scattered by the substrate 14, and the frequency spectrum is captured by one or more detectors 20, 22

(comprising respective pixelated sensors). After sufficient data has been acquired, i.e. the process parameters of interest have been sufficiently established from the measurement, the metrology apparatus 2 is controlled to move the beam 6 to a new target area, and the process is repeated. The time spent on each target area 12 is referred to as the acquisition time or period. At the beginning of each acquisition period ($t_0$) a first reference data set $I_0$ may be obtained. One or more further data sets may then be obtained during the acquisition period, which are compared to $I_0$ as described herein to determine one or more alignment properties of the beam. The alignment properties of the beam 6 relate to, for example, the alignment of the source 3 (of the irradiation system 4). A coordinate transformation, according to a tool configuration, may be used to determine the position of a component of the metrology apparatus 2 from the determined position of the radiation beam. In an alternative embodiment, the reference image $I_0$ may be captured at intervals during the acquisition period.

Alternatively, or in addition, a first set of intensity data $I_0$ may be obtained during calibration, at a time before the first acquisition period. Calibration may be carried out periodically, e.g. on a weekly or monthly basis (or some other period). One or more first sets $I_0$ may be obtained and stored during calibration, and then accessed during target measurement (during the acquisition period) in order to determine one or more alignment properties. This allows the change of alignment properties between calibrations to be determined.

The rate at which data sets are obtained (the sampling rate) determines how quickly the system can adapt to changes in the alignment properties. One or more components of the tool may be subject to periodic disturbances, and a high capture rate may be used to avoid aliasing.

Figure 9:
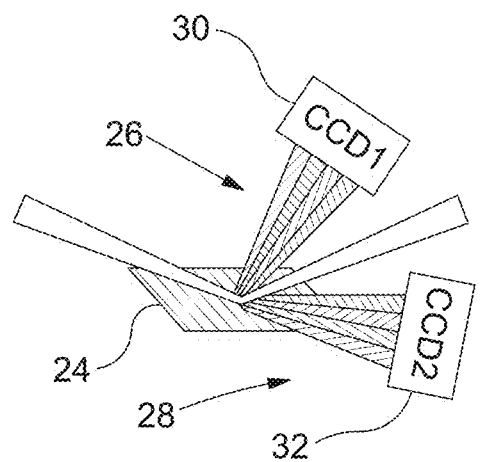
FIG. 9 depicts conical diffraction from a reference grating.

FIG. 9 shows an embodiment in which, instead of a planar reference grating a conical reference grating 24 is used. A grating in a conical configuration is positioned such that the plane in which the incident beam reflects (zeroth order), also called the meridional plane, is not orthogonal to the direction of the grating lines. In principle it can be at any other angle than 90 degrees, but often the angle is zero degrees. In this case, the grating lines are thus parallel to the meridional plane. The conical reference grating 24 gives both +1 and −1 diffraction orders 26, 28 that can be captured by two detectors 30, 32 (comprising a first pixelated sensor and a second pixelated sensor respectively). A lateral shift of the source 3 (in the dispersive direction on the reference detectors) will lead to an asymmetric response in both +1 and −1 detectors 30, 32. This makes the need for a zero-image $I_0$ unnecessary. Instead, the difference between the two detectors 30, 32 is taken as in a balanced photodetector. In this embodiment the first set of intensity data is obtained from a first detector 30 and the second set of intensity data is obtained from a second detector 32. The first set of intensity data represents a projection of a first beam of radiation onto the (first) pixelated sensor of the first detector 30, and the second set of intensity data represents a projection of a second beam of radiation onto the (second) pixelated sensor of the second detector 32. The first beam of radiation comprises a part of the source emission spectrum diffracted into a first positive diffraction order (+1). The second beam of radiation comprises the same part of the source emission spectrum, but diffracted into a first negative diffraction order (−1). For example, if the first set of intensity data represents the third harmonic with +1 diffraction order, then the second set of intensity data is the third harmonic with −1 diffraction order. The data sets may then be processed as described above, for example in steps a) to f). In step a) a zeroth-image $I_0$ (the first set of intensity data) is obtained from the first detector 30. In step b) a k-th image $I(t_k)$ is obtained from the second detector 32. Steps c) to f) then follow as set out above. The conical configuration may be used in such a way that there is basically no zeroth image Io, but at every time instance tk, the images on the two detectors are subtracted from each other. Alternatively one may consider that a zeroth-image Io is obtained from detector 30, but at every instance of time tk, a new Io is provided by that detector to use in the procedure with the I(tk) of the other detector 32. Because two different detectors 30, 32 are used, the first and second sets of intensity data may be obtained simultaneously.

In the non-dispersive direction, the displacement is symmetric for +1 and −1 detectors 30, 32 and a zeroth-image is still needed. That is, if the first and second radiation beams are translated by the same amount in the same direction (i.e. symmetrically), then any difference between them is cancelled. Instead, each detector may have its own zeroth-image $I_0$ captured at an earlier time (e.g. during calibration or at the beginning of the acquisition period). The processing can then be carried out separately for each of the detectors 30, 32. That is, first and second sets of intensity data are obtained from the first detector 30 and processed, and different first and second sets of intensity data are obtained from the second detector 32 and processed. Hence, any translation of the illumination beam of radiation in the non-dispersive direction should produce the same first and second signal values ($S_x$ and $S_y$) from the first and second detectors 30, 32.

The metrology apparatus configuration could be adapted to have the balanced detection measure the direction in the wafer plane that is most sensitive to source fluctuations.

Figure 10:
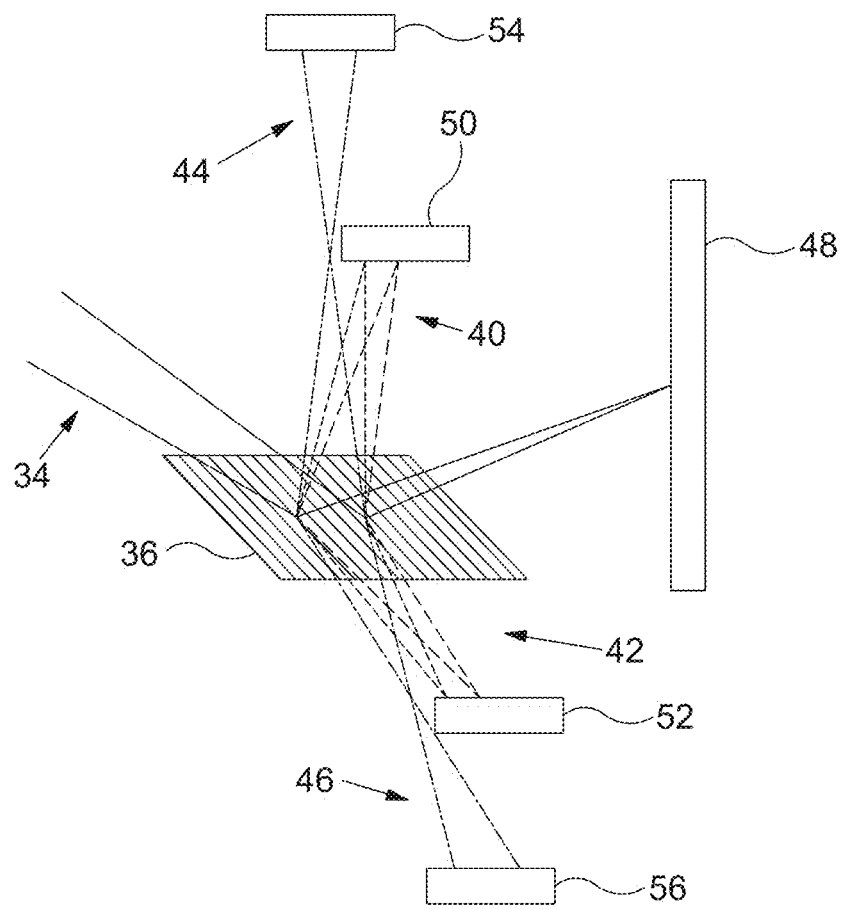
FIG. 10 depicts a part of the reference branch with a near-field and a far-field detector.

FIG. 10 shows a setup of the reference detection branch of the metrology apparatus in another embodiment. (It will be recalled that in FIG. 1 the reference detection branch comprises reference grating 8 and reference detector 10.) In FIG. 10, an illumination beam of radiation 34 illuminates a reference grating 36 (which may be considered as a first periodic structure) and is diffracted into a zeroth order 38, a first positive part 40, a first negative part 42, a second positive part 44 and a second negative part 46 of diffraction. The beam diffracted into the zeroth order 38 is focused onto a target area of a substrate 48 (which may comprise a substrate periodic structure formed on the substrate). The higher orders are incident upon near-field detectors 50, 52 (which are examples of reference detectors) and far-field detectors 54, 56 (which may be referred to as second detectors). A part of the diffracted orders 44, 46 of the grating pass the reference detectors 50, 52 and are detected by the second detectors 54, 56 in the far field. The signals detected by the second detectors (i.e. far-field detectors) 54, 56 are sensitive to angular fluctuations of the illumination beam of radiation 34. The obtained signals are (as a result of detection in the far field) indicative for the beam pointing (i.e. the propagation direction) rather than the source positioning. The wavelength resolution in the far field may deteriorate as a result of divergence of the radiation. The spot size of the diffracted radiation in the far field will lower the intensity gradients on the second detectors 54, 56. However, the second detectors 54, 56 will still provide a useful signal. The assumed required accuracy may be 200 nm over a spot of 50 µm (5 pixels), which yields 1/250th of the imaged spot. In order not to sacrifice light within a wavelength regime of interest, the second diffraction orders (+2,−2) from the reference grating 36 can be used, which are angularly displaced from the first orders and can be directed past the reference detectors 50, 52 to the second detectors (far-field detectors) 54, 56 dedicated for this purpose. That is, the second positive part 44 may be the second positive diffraction order, and the second negative part 46 may be the second negative diffraction order.

The same method can be used for the grating 18 in the specular detection branch, enabling sensitive monitoring of misalignment between the metrology apparatus 2 and the substrate 14. That is, the method can be applied to the images/data received from the detectors in the specular detection branch. The method then enables alignment control of the substrate support 15.

The signals for detectors of embodiments of the invention can be used for optimizing/stabilizing the position of the source 3 and beam pointing of the illumination beam of radiation 6, 34. In addition, they may be used as tool-knowledge in the data analysis. For example if a tilt of the substrate 14 is detected in the specular detection branch this can be used to correct signals received from the higher order detector 22. Another example is a residual beam pointing error that leads to shifts or blurring of the images received from the higher order detector 22. The effect of the shifts or blurring can be reduced if the residual beam pointing error is known.

Figure 11:
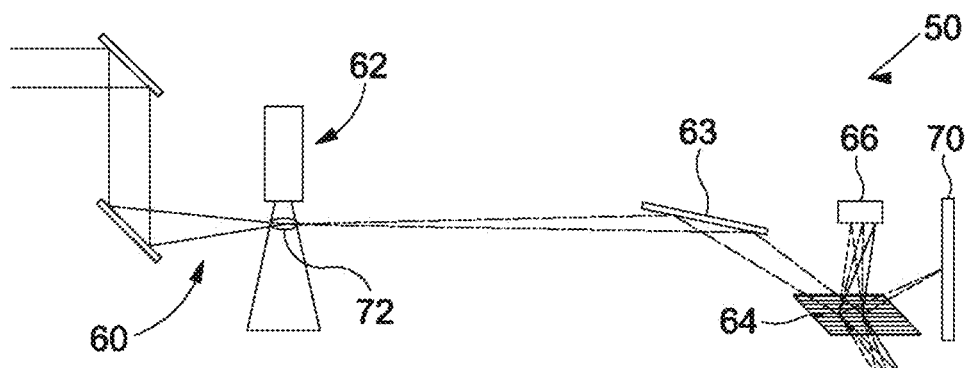
FIG. 11 depicts a part of a metrology apparatus with a HHG source.

FIG. 11 shows a part of the metrology setup 58 with an IR drive (seeding) laser beam 60, and a HHG source 62, a mirror 63, reference grating 64, a first detector 66, a second detector 68 and a substrate 70. The IR beam 60 interacts with a gas-jet 72 of the HHG source 62 to generate an illumination beam with multiple harmonics of radiation, with frequencies that are odd multiples of the frequency of the IR radiation. The illumination beam is diffracted by the reference grating 64. The zeroth order of diffracted light is incident upon the substrate 70. Higher orders (at least the first order) of diffracted light are captured by the first and second detectors 66, 68. The detectors comprise respective pixelated sensors. The higher diffraction orders comprise beams of different harmonics of radiation that are projected onto the pixelated sensors of the two detectors 66, 68. Sets of intensity data, representing the beams projected onto the pixelate sensors, can be obtained from the detectors 66, 68 and processed to determine one or more alignment properties of the illumination beam. In particular, a zeroth-image $I_0$ (a first intensity data set) and a k-th image $I(t_k)$ may be captured by one or both of the detectors 66, 68, and processed as set out in steps a) to f) above.

The proposed method may provide one or more of the following advantages: it is cheap, deals with the problem of spot to target positioning and beam pointing from the soft X-ray perspective, instead of relying on indirect results from the IR drive laser and at the same time provides wavelength dependent signals. It may also provide both position and beam pointing information at two stages in the tool (reference and specular detection), enabling stabilization control of the irradiation system and the tool (including the substrate support).

Figure 12:
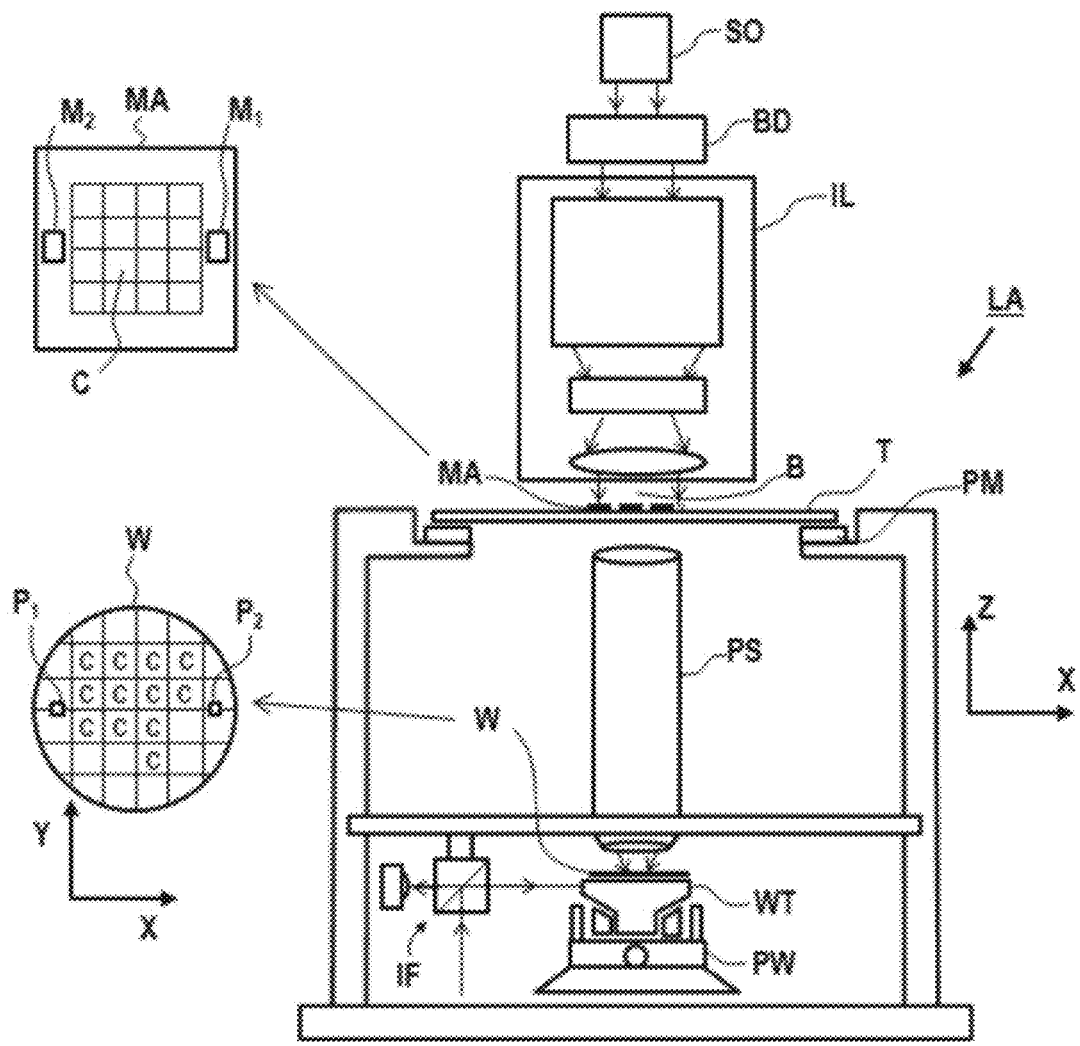
FIG. 12 depicts a schematic overview of a lithographic apparatus.
Figure 13:
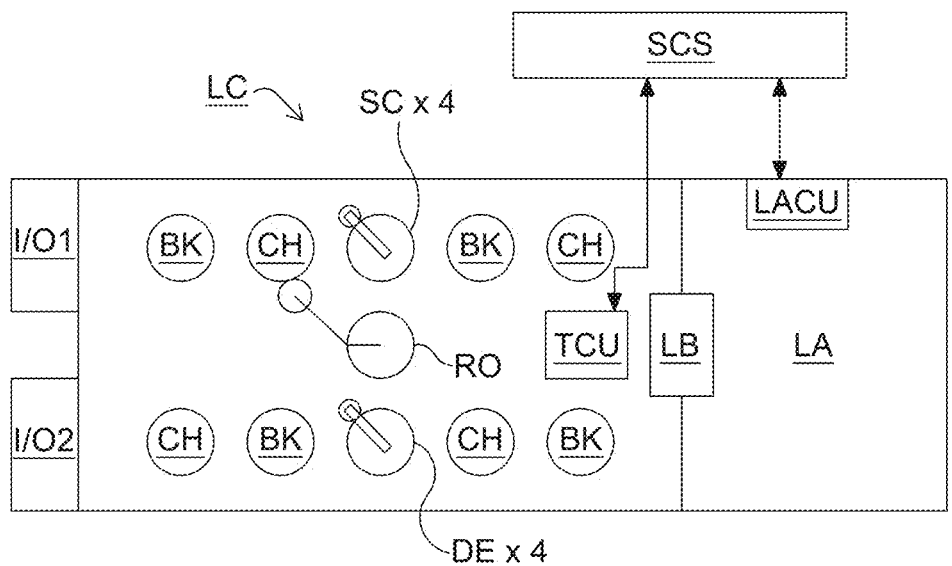
FIG. 13 depicts a schematic overview of a lithographic cell.
Figure 14:
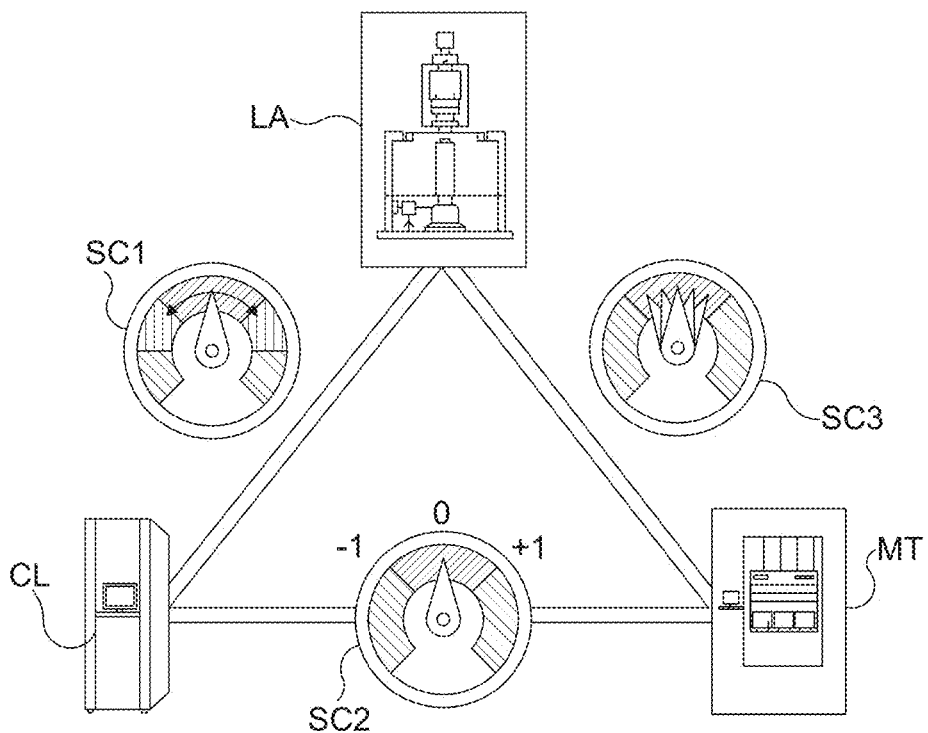
FIG. 14 depicts a schematic representation of holistic lithography, representing a cooperation between three key technologies to optimize semiconductor manufacturing.

We now describe FIGS. 12 to 14, which provide an overview of a lithographic apparatus and cell, and some key technologies used in semiconductor manufacturing.
Lithography Apparatus The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. More information on such mirror arrays is given in U.S. Pat. Nos. 5,296,891 and 5,523,193, which are incorporated herein by reference.

a programmable LCD array. An example of such a construction is given in U.S. Pat. No. 5,229,872, which is incorporated herein by reference.

FIG. 12 schematically depicts a lithographic apparatus LA. The patterns present on the above discussed substrates and/or wafers may be manufactured by means of the lithographic apparatus LA and the later discussed Lithographic Cell LC. The lithographic apparatus LA includes an illumination system (also referred to as illuminator) IL configured to condition a radiation beam B (e.g., UV radiation, DUV radiation or EUV radiation), a support structure (e.g., a mask table) T constructed to support a patterning device (e.g., a mask) MA and connected to a first positioner PM configured to accurately position the patterning device MA in accordance with certain parameters, a substrate table (e.g., a wafer table or substrate support) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W. Certain embodiments of the lithographic apparatus LA may have an illumination system that comprises, for example in line with the illumination branch of metrology apparatus 2 a reference grading 8 and a reference detector 10 that comprises a pixelated sensor. The above discussed embodiments of a method to determine one or more alignment properties may also be used in such a lithographic apparatus. Determined alignment properties may be used in a control system that provides a closed loop feedback. The control system may, for example, control characteristics source SO or illumination system IL. Alternatively, the control system may control first and/or second positioners PM, PW.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S.

Pat. No. 6,952,253 and in PCT publication No. WO99-49504, which are incorporated herein by reference.

The lithographic apparatus LA may also be of a type having two (dual stage) or more substrate tables WT and, for example, two or more support structure T (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table T), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 12) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Lithographic Cell

As shown in FIG. 13 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may comprise the part of the metrology apparatus 2 depicted in FIG. 1. The reference detector 10 may be used to measure a reference spectrum of radiation of the illumination beam of radiation 6 upstream of the substrate 14 (i.e. before the illumination beam interacts with the substrate 14). The specular detection branch detector 20 may be used to measure a spectrum of radiation downstream of the substrate 14. The two spectra may be compared and processed to determine one or more properties of a structure on the substrate 14.

The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

The metrology apparatus may be used in accordance with any of the above described embodiments to determine one or more alignment properties of an illumination beam of radiation, wherein said illumination beam is for irradiating a target area on the substrate in the metrology apparatus.

Holistic Lithography

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 14. One of these systems is the lithographic apparatus LA which is (virtually) connected to a metrology apparatus MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 14 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology apparatus MT) to predict whether defects may be present due to e.g. sub-optimal processing (depicted in FIG. 14 by the arrow pointing "0" in the second scale SC2). The computer system CL may process intensity data obtained from the metrology apparatus MT to determine one or more alignment properties of an illumination beam of radiation used to irradiate a target area on a substrate. The metrology apparatus MT may comprise the part of the metrology apparatus 2 depicted in FIG. 1.

The metrology apparatus MT may provide input to the computer system CL to enable accurate simulations and predictions, and may provide feedback to the lithographic apparatus LA to identify possible drifts, e.g. in a calibration status of the lithographic apparatus LA (depicted in FIG. 14 by the multiple arrows in the third scale SC3).

Figure 15:
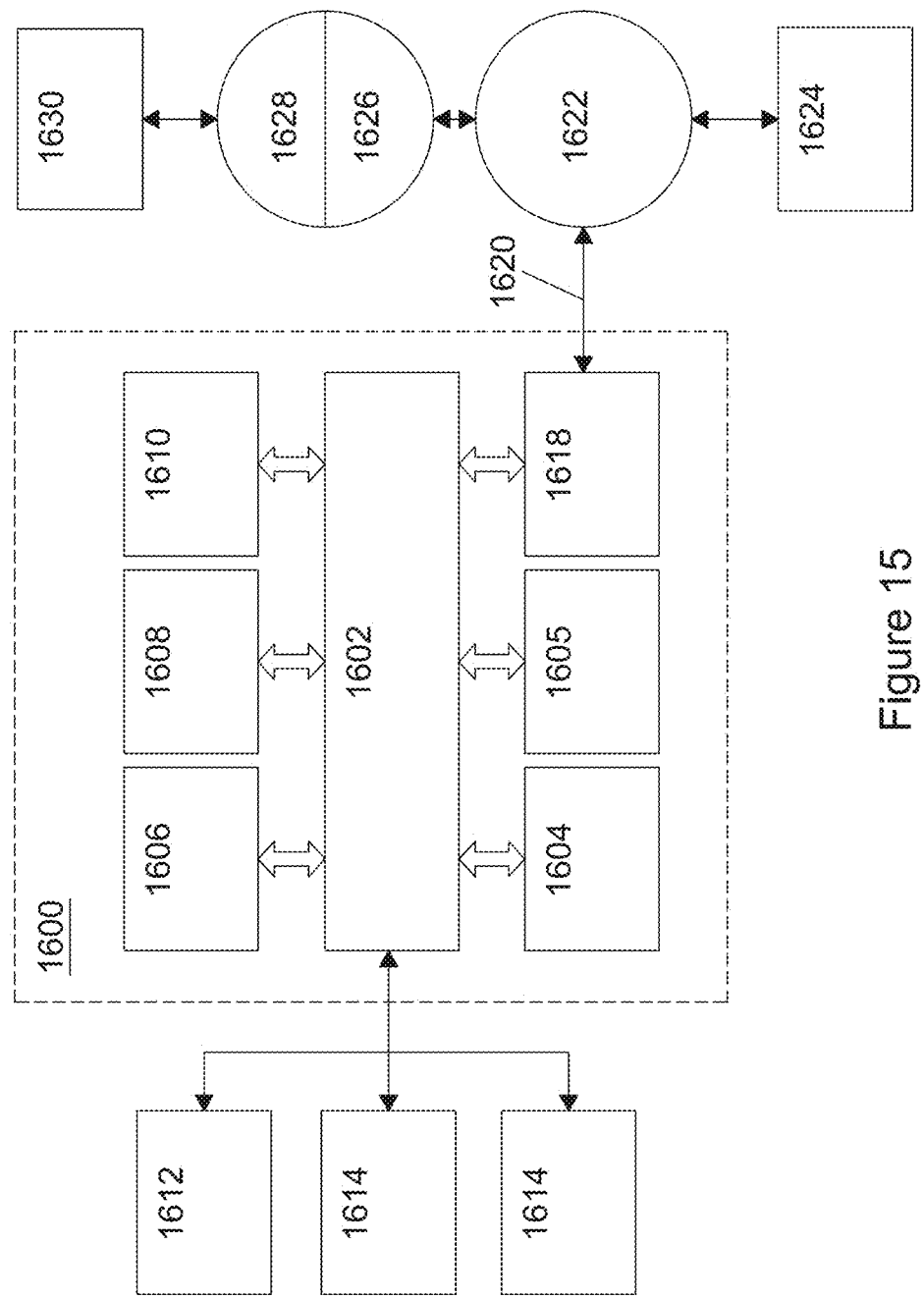
FIG. 15 schematically depicts an example computer system in which embodiments can be implemented.

FIG. 15 is a block diagram that illustrates a computer system 1600 that may assist in implementing the methods and flows disclosed herein. Computer system 1600 includes a bus 1602 or other communication mechanism for communicating information, and a processor 1604 (or multiple processors 1604 and 1605) coupled with bus 1602 for processing information. Computer system 1600 also includes a main memory 1606, such as a random access memory (RAM) or other dynamic storage device, coupled to bus 1602 for storing information and instructions to be executed by processor 1604. Main memory 1606 also may be used for storing temporary variables or other intermediate information during execution of instructions to be executed by processor 1604. Computer system 1600 further includes a read only memory (ROM) 1608 or other static storage device coupled to bus 1602 for storing static information and instructions for processor 1604. A storage device 1610, such as a magnetic disk or optical disk, is provided and coupled to bus 1602 for storing information and instructions.

Computer system 1600 may be coupled via bus 1602 to a display 1612, such as a cathode ray tube (CRT) or flat panel or touch panel display for displaying information to a computer user. An input device 1614, including alphanumeric and other keys, is coupled to bus 1602 for communicating information and command selections to processor 1604. Another type of user input device is cursor control 1616, such as a mouse, a trackball, or cursor direction keys for communicating direction information and command selections to processor 1604 and for controlling cursor movement on display 1612. This input device typically has two degrees of freedom in two axes, a first axis (e.g., x) and a second axis (e.g., y), that allows the device to specify positions in a plane. A touch panel (screen) display may also be used as an input device.

One or more of the methods as described herein may be performed by computer system 1600 in response to processor 1604 executing one or more sequences of one or more instructions contained in main memory 1606. Such instructions may be read into main memory 1606 from another computer-readable medium, such as storage device 1610. Execution of the sequences of instructions contained in main memory 1606 causes processor 1604 to perform the process steps described herein. One or more processors in a multi-processing arrangement may also be employed to execute the sequences of instructions contained in main memory 1606. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1604 for execution. Such a medium may take many forms, including but not limited to, non-volatile media, volatile media, and transmission media. Non-volatile media include, for example, optical or magnetic disks, such as storage device 1610. Volatile media include dynamic memory, such as main memory 1606. Transmission media include coaxial cables, copper wire and fiber optics, including the wires that comprise bus 1602. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1604 for execution. For example, the instructions may initially be borne on a magnetic disk of a remote computer. The remote computer can load the instructions into its dynamic memory and send the instructions over a telephone line using a modem. A modem local to computer system 1600 can receive the data on the telephone line and use an infrared transmitter to convert the data to an infrared signal. An infrared detector coupled to bus 1602 can receive the data carried in the infrared signal and place the data on bus 1602. Bus 1602 carries the data to main memory 1606, from which processor 1604 retrieves and executes the instructions. The instructions received by main memory 1606 may optionally be stored on storage device 1610 either before or after execution by processor 1604.

Computer system 1600 also preferably includes a communication interface 1618 coupled to bus 1602. Communication interface 1618 provides a two-way data communication coupling to a network link 1620 that is connected to a local network 1622. For example, communication interface 1618 may be an integrated services digital network (ISDN) card or a modem to provide a data communication connection to a corresponding type of telephone line. As another example, communication interface 1618 may be a local area network (LAN) card to provide a data communication connection to a compatible LAN. Wireless links may also be implemented. In any such implementation, communication interface 1618 sends and receives electrical, electromagnetic or optical signals that carry digital data streams representing various types of information.

Network link 1620 typically provides data communication through one or more networks to other data devices. For example, network link 1620 may provide a connection through local network 1622 to a host computer 1624 or to data equipment operated by an Internet Service Provider (ISP) 1626. ISP 1626 in turn provides data communication services through the worldwide packet data communication network, now commonly referred to as the "Internet" 1628. Local network 1622 and Internet 1628 both use electrical, electromagnetic or optical signals that carry digital data streams. The signals through the various networks and the signals on network link 1620 and through communication interface 1618, which carry the digital data to and from computer system 1600, are exemplary forms of carrier waves transporting the information.

Computer system 1600 may send messages and receive data, including program code, through the network(s), network link 1620, and communication interface 1618. In the Internet example, a server 1630 might transmit a requested code for an application program through Internet 1628, ISP 1626, local network 1622 and communication interface 1618. One such downloaded application may provide for one or more of the techniques described herein, for example. The received code may be executed by processor 1604 as it is received, and/or stored in storage device 1610, or other non-volatile storage for later execution. In this manner, computer system 1600 may obtain application code in the form of a carrier wave.

The processors 1604, 1605 may be used to process the data sets obtained from the detector or detectors of the metrology apparatus. In particular the processors 1604, 1605 may perform the steps a) to f) of comparing the data sets to determine one or more alignment properties of one or more of the radiation beam, the radiation source, the substrate, the metrology apparatus or one of its components. The computer-readable storage medium stores the instructions for obtaining the intensity data from the detector or detectors used to measure the frequency spectrum, as well as the instructions for processing them according to the described methods, and outputting a signal value indicative of an alignment property (e.g. beam/source position).

Further embodiments are presented in the subsequent numbered clauses:

1. A method of determining one or more alignment properties of an illumination beam of radiation emitted by a radiation source, wherein said illumination beam is for irradiating a target area on a substrate in a metrology apparatus, said method comprising:

(a) obtaining a first set of intensity data representing a reference measurement, said first set of intensity data representing a projection of a first beam of radiation originating from said illumination beam of radiation onto a first pixelated sensor;

(b) obtaining a second set of intensity data representing a projection of a second beam of radiation originating from said illumination beam of radiation onto the first pixelated sensor or a second pixelated sensor; and (c) processing said first and second sets of intensity data to determine said one or more alignment properties of said illumination beam of radiation;

wherein said processing involves comparing said first and second sets of intensity data to calculate a signal value which is indicative of a change in an alignment property of said illumination beam of radiation.

2. A method according to clause 1, wherein said second set of intensity data represents said projection of said second beam of radiation onto said second pixelated sensor and steps (a) and (b) are performed simultaneously.

3. A method according to clause 1, wherein said second set of intensity data represents said projection of said second beam of radiation onto said first pixelated sensor, and steps (a) and (b) are performed sequentially in time.

4. A method according to clause 3, wherein
said projection of said second beam differs in position relative to said projection of said first beam by a distance; and
said processing involves comparing said first and second sets of intensity data to calculate a value which is indicative of said distance.

5. A method according to clause 4, wherein said distance is less than the size of a pixel of said first or second pixelated sensor.

6. A method according to any preceding clause, wherein said step of processing comprises:
subtracting the second set of intensity data from the first set of intensity data to obtain a difference matrix;
calculating a gradient of intensity of the first set of intensity data to obtain a first gradient matrix;
performing elementwise multiplication of said difference matrix and said first gradient matrix to obtain a first signal matrix; and
summing elements of said first signal matrix to obtain a first signal value indicative of a translation of said projection of said second beam along a first axis to a first coordinate in a plane of said first or second pixelated sensor.

7. A method according to clause 6, further comprising performing a coordinate transformation on said first coordinate according to a tool configuration to obtain a first source coordinate, wherein said first source coordinate defines a position of said radiation source.

8. A method according to clause 6 or 7, further comprising calculating a second gradient of intensity of the first set of intensity data to obtain a second gradient matrix;
performing elementwise multiplication of said difference matrix and said second gradient matrix to obtain a second signal matrix; and
summing elements of said second signal matrix to obtain a second signal value indicative of a translation of said projection of said second beam along a second axis to a second coordinate in a plane of said first or second pixelated sensor.

9. A method according to clause 8, wherein said first axis is substantially perpendicular to said second axis.

10. A method according to clause 8 or 9, further comprising performing a coordinate transformation on said second coordinate according to a tool configuration to obtain a second source coordinate, wherein said second source coordinate defines a position of said radiation source.

11. A method according to any preceding clause, wherein said steps of obtaining intensity data comprise detecting beams of radiation diffracted by a first periodic structure.

12. A method according to clause 11, wherein said first periodic structure is arranged to diffract radiation into at least a first positive diffraction order and a first negative diffraction order, and said first beam of radiation comprises said radiation diffracted into said first positive diffraction order and said second beam of radiation comprises said radiation diffracted into said first negative diffraction order.

13. A method according to 11 or 12, wherein said first periodic structure is arranged to diffract radiation into a second diffraction order, and said first and second sets of intensity data are obtained by detecting radiation diffracted into said second diffraction order.

14. A method according to clause 11, 12 or 13, wherein said first pixelated sensor is in the far-field of said first periodic structure.

15. A method according to anyone of clauses 11 to 14, wherein said second pixelated sensor is in the far-field of said first periodic structure.

16. A method according to any preceding clause, wherein said radiation source is a higher harmonic generation (HHG) source, and said illumination beam of radiation comprises a plurality of harmonics of radiation.

17. A method according to any one of clauses 1 to 15, wherein said radiation source is a target area on a substrate, and radiation emitted by said radiation source is radiation reflected by said target area.

18. A method according to clause 17, wherein said target area comprises a substrate periodic structure formed on said substrate, and radiation emitted by said radiation source is radiation diffracted by said substrate periodic structure.

19. A method according to clause 15, wherein said illumination beam of radiation is a beam of radiation diffracted into a zeroth diffraction order by said substrate periodic structure.

20. A method according to any preceding clause, wherein said one or more alignment properties comprise a position of said illumination beam of radiation.

21. A method according to any preceding clause, wherein said one or more alignment properties comprise a propagation direction from the radiation source of said illumination beam of radiation.

22. A method according to any preceding clause, wherein said first and second beams of radiation comprise wavelengths forming a part but not the whole of a radiation source emission spectrum.

23. A method according to clause 22, wherein:
step (a) further comprises obtaining one or more further first sets of intensity data, wherein each of said further first sets represents a beam of radiation consisting of other wavelengths forming a part but not the whole of the radiation source emission spectrum;
step (b) further comprises obtaining one or more respective further second sets of intensity data, wherein said respective further second sets represent said other wavelengths; and
step (c) further comprises processing said further first sets of intensity data and said respective further second sets of intensity data, by comparing the first sets with respective second sets of intensity data, to determine one or more further alignment properties related to said other wavelengths.

24. A method according to clause 23, wherein said wavelengths and said other wavelengths comprise different harmonics of radiation in the radiation source emission spectrum.

25. A method according to clause 23, further comprising combining said one or more further alignment properties to obtain one or more combined alignment properties.

26. A method of stabilizing an illumination beam of radiation, said method comprising:
determining one or more alignment properties of said illumination beam of radiation according to a method of any preceding clause; and
using said one or more alignment properties to control the radiation source in order to adjust a value of at least one of said alignment properties to a target value of said at least one alignment properties.

27. A method of stabilizing the position of an illumination beam of radiation, said method comprising:
determining one or more alignment properties of said illumination beam of radiation according to a method of any preceding clause, wherein said one or more alignment properties comprise a position of the illumination beam of radiation; and
using the determined position to control the radiation source in order to adjust the position of said illumination beam of radiation to a target position.

28. A method of stabilizing the beam pointing of an illumination beam of radiation, said method comprising:
determining one or more alignment properties of said illumination beam of radiation according to any preceding clause, wherein said one or more alignment properties comprise a propagation direction from the radiation source of the illumination beam of radiation; and
using the determined propagation direction to control the radiation source in order to adjust the propagation direction of the illumination beam of radiation to a target propagation direction.

29. A method according to clause 26, 27, or 28, wherein said step of using comprises providing closed loop feedback to a control system.

30. A metrology apparatus for use in determining a property of a structure on a substrate and to determine one or more alignment properties of an illumination beam of radiation emitted by a radiation source, said apparatus comprising:
an irradiation system for generating said illumination beam of radiation;
a substrate support operable with the irradiation system for irradiating a periodic structure formed on a target area of the substrate held by said substrate support;
a specular detection branch detector for detecting a spectrum of radiation diffracted by the periodic structure; and
one or more processors configured to:
obtain a first set of intensity data representing a reference measurement, said first set of intensity data representing a projection of a first beam of radiation originating from said illumination beam of radiation onto a first pixelated sensor;
obtain a second set of intensity data, said second set of intensity data representing a projection of a second beam of radiation originating from said illumination beam of radiation onto said first pixelated sensor, or a second pixelated sensor; and
process said first and second sets of intensity data to determine said one or more alignment properties of said illumination beam of radiation;
wherein said processing involves comparing said first and second sets of intensity data to calculate a value which is indicative of a change in an alignment property of said illumination beam of radiation.

31. A metrology apparatus according to clause 30, further comprising a reference detector for detecting a reference spectrum of radiation of said illumination beam of radiation upstream of said periodic structure.

32. A metrology apparatus according to clause 31, wherein said property of the structure is determined from said spectrum of radiation and said reference spectrum of radiation.

33. A metrology apparatus according to clause 30, 31 or 32, wherein said specular detection branch detector comprises said first pixelated sensor.

34. A metrology apparatus according to clause 31 or 32, wherein said reference detector comprises said first pixelated sensor.

35. A metrology apparatus according to any one of clauses 30 to 34, further comprising a control system configured to control at least one of said irradiation system and said substrate support, in order to adjust a value of at least one of said alignment properties to a target value of said at least one alignment properties.

36. A metrology apparatus as clause defined in any one of clauses 30 to 35, wherein said one or more processors are configured to perform the method of any one of clauses 1 to 29.

37. A lithographic cell comprising a metrology apparatus according to anyone of clauses 30 to 36.

38. A computer program product comprising a non-transitory computer readable medium having instructions recorded thereon, the instructions when executed by a computer implementing a method of any one of clauses 1 to 29.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), and thin film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) condition.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A method of determining one or more alignment properties of an incident illumination beam of radiation emitted by a radiation source, wherein the incident illumination beam is for irradiating a target area on a substrate in a metrology apparatus, the method comprising:
   obtaining a first set of intensity data representing a reference measurement, the first set of intensity data representing a projection of a first beam of radiation originating from the incident illumination beam of radiation onto a first pixelated sensor;
   obtaining a second set of intensity data representing a projection of a second beam of radiation originating from the incident illumination beam of radiation onto a second pixelated sensor; and
   processing the first and second sets of intensity data to determine the one or more alignment properties of the incident illumination beam of radiation;
   wherein the processing involves comparing the first and second sets of intensity data to calculate a signal value that is indicative of a change in an alignment property of the incident illumination beam of radiation;
   wherein the obtaining of the first and second sets of intensity data are performed sequentially in time such that the projection of the second beam differs in position relative to the projection of the first beam by a distance, and the processing involves comparing the first and second sets of intensity data to calculate a value which is indicative of the distance; and
   wherein the distance is less than a width of a pixel of the first or second pixelated sensor.

2. The method of claim 1, wherein the steps of obtaining intensity data comprise detecting beams of radiation diffracted by the first periodic structure.

3. The method of claim 2, wherein the first periodic structure is arranged to diffract radiation into at least a first positive diffraction order and a first negative diffraction order, and the first beam of radiation comprises the radiation diffracted into the first positive diffraction order and the second beam of radiation comprises the radiation diffracted into the first negative diffraction order.

4. The method of claim 2, wherein the first periodic structure is arranged to diffract radiation into a second diffraction order, and the first and second sets of intensity data are obtained by detecting radiation diffracted into the second diffraction order.

5. The method of claim 2, wherein the first pixelated sensor is in the far-field of the first periodic structure.

6. The method of claim 2, wherein the second pixelated sensor is in the far-field of the first periodic structure.

7. The method of claim 1, wherein radiation reflected by the target area is detected in a specular detection branch and is used to obtain the first and second sets of intensity data.

8. The method of claim 1, wherein a portion of the incident illumination beam is detected in a reference detection branch and is used to obtain the first and second sets of intensity data.

9. A method of stabilizing an incident illumination beam of radiation, the method comprising:
   determining one or more alignment properties of the incident illumination beam of radiation according to a method of claim 1; and
   using the one or more alignment properties to control the radiation source in order to adjust a value of at least one of the alignment properties to a target value of the at least one alignment properties.

10. A metrology apparatus for use in determining a property of a structure on a substrate and to determine one or more alignment properties of an incident illumination beam of radiation emitted by a radiation source, the apparatus comprising:
   an irradiation system for generating the incident illumination beam of radiation;
   a substrate support operable with the irradiation system for irradiating a periodic structure formed on a target area of the substrate held by the substrate support;
   a specular detection branch detector for detecting a spectrum of radiation diffracted by the periodic structure; and
   one or more processors configured to:
      obtain a first set of intensity data representing a reference measurement, the first set of intensity data representing a projection of a first beam of radiation originating from the incident illumination beam of radiation onto a first pixelated sensor;
      obtain a second set of intensity data, the second set of intensity data representing a projection of a second beam of radiation originating from the incident illumination beam of radiation onto a second pixelated sensor; and
      process the first and second sets of intensity data to determine the one or more alignment properties of the incident illumination beam of radiation;
      wherein the processing involves comparing the first and second sets of intensity data to calculate a value which is indicative of a change in an alignment property of the incident illumination beam of radiation;
      wherein the obtaining of the first and second sets of intensity data are performed sequentially in time such that the projection of the second beam differs in position relative to the projection of the first beam by a distance, and the processing involves comparing the first and second sets of intensity data to calculate a value which is indicative of the distance; and
      wherein the distance is less than a width of a pixel of the first or second pixelated sensor.

11. The metrology apparatus of claim 10, wherein the one or more processors are further configured to use the alignment property to control the incident illumination beam in order to adjust a value of the alignment property.

12. A metrology apparatus for use in determining a property of a structure on a substrate and to determine one or more alignment properties of an incident illumination beam of radiation emitted by a radiation source, the apparatus comprising:
- an irradiation system for generating the incident illumination beam of radiation;
- a substrate support operable with the irradiation system for irradiating a periodic structure formed on a target area of the substrate held by the substrate support;
- a specular detection branch detector for detecting a spectrum of radiation diffracted by the periodic structure; and
- one or more processors configured to:
- obtain a first set of intensity data representing a reference measurement, the first set of intensity data representing a projection of a first beam of radiation originating from the incident illumination beam of radiation onto a first pixelated sensor;
- obtain a second set of intensity data, the second set of intensity data representing a projection of a second beam of radiation originating from the incident illumination beam of radiation onto the first pixelated sensor, or a second pixelated sensor; and
- process the first and second sets of intensity data to determine the one or more alignment properties of the incident illumination beam of radiation, wherein the processing comprises:
  - subtracting the second set of intensity data from the first set of intensity data to obtain a difference matrix;
  - calculating a gradient of intensity of the first set of intensity data to obtain a first gradient matrix;
  - performing elementwise multiplication of the difference matrix and the first gradient matrix to obtain a first signal matrix; and
  - summing elements of the first signal matrix to obtain a first signal value indicative of a translation of the projection of the second beam along a first axis to a first coordinate in a plane of the first or second pixelated sensor.

13. The method of claim 12, further comprising performing a coordinate transformation on the first coordinate according to a tool configuration to obtain a first source coordinate, wherein the first source coordinate defines a position of the radiation source.

14. The method of claim 12, further comprising calculating a second gradient of intensity of the first set of intensity data to obtain a second gradient matrix;
- performing elementwise multiplication of the difference matrix and the second gradient matrix to obtain a second signal matrix; and
- summing elements of the second signal matrix to obtain a second signal value indicative of a translation of the projection of the second beam along a second axis to a second coordinate in a plane of the first or second pixelated sensor; and
- wherein the first axis is substantially perpendicular to the second axis.

15. A method of determining one or more alignment properties of an incident illumination beam of radiation emitted by a radiation source, wherein the incident illumination beam is for irradiating a target area on a substrate in a metrology apparatus, the method comprising:
- obtaining a first set of intensity data representing a reference measurement, the first set of intensity data representing a projection of a first beam of radiation originating from the incident illumination beam of radiation onto a first pixelated sensor;
- obtaining a second set of intensity data representing a projection of a second beam of radiation originating from the incident illumination beam of radiation onto the first pixelated sensor or a second pixelated sensor; and
- processing the first and second sets of intensity data to determine the one or more alignment properties of the incident illumination beam of radiation, wherein the processing comprises:
  - subtracting the second set of intensity data from the first set of intensity data to obtain a difference matrix;
  - calculating a gradient of intensity of the first set of intensity data to obtain a first gradient matrix;
  - performing elementwise multiplication of the difference matrix and the first gradient matrix to obtain a first signal matrix; and
  - summing elements of the first signal matrix to obtain a first signal value indicative of a translation of the projection of the second beam along a first axis to a first coordinate in a plane of the first or second pixelated sensor.

16. A method of stabilizing an incident illumination beam of radiation, the method comprising:
- determining one or more alignment properties of the incident illumination beam of radiation according to a method of claim 15; and
- using the one or more alignment properties to control the radiation source in order to adjust a value of at least one of the alignment properties to a target value of at least one of the alignment properties.

* * * * *